(12) United States Patent
Kang et al.

(10) Patent No.: US 10,256,390 B2
(45) Date of Patent: *Apr. 9, 2019

(54) SOLAR POWER GENERATION SYSTEM

(71) Applicant: KOREA INSTITUTE OF ENERGY RESEARCH, Daejeon (KR)

(72) Inventors: Yong Heack Kang, Daejeon (KR); Sang Nam Lee, Daejeon (KR); Jong Kyu Kim, Daejeon (KR); Hyun Jin Lee, Daejeon (KR); Chang Kyun Yu, Daejeon (KR); Hwan Ki Yoon, Daejeon (KR); Kwan Kyo Chai, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 612 days.

This patent is subject to a terminal disclaimer.

(21) Appl. No.: 14/759,200

(22) PCT Filed: Aug. 6, 2013

(86) PCT No.: PCT/KR2013/007100
§ 371 (c)(1),
(2) Date: Jul. 3, 2015

(87) PCT Pub. No.: WO2014/189173
PCT Pub. Date: Nov. 27, 2014

(65) Prior Publication Data
US 2015/0357545 A1 Dec. 10, 2015

(30) Foreign Application Priority Data
May 21, 2013 (KR) .................. 10-2013-0056812

(51) Int. Cl.
*H01L 35/30* (2006.01)
*F24S 20/20* (2018.01)
(Continued)

(52) U.S. Cl.
CPC ............... *H01L 35/30* (2013.01); *F24J 2/07* (2013.01); *F24J 2/32* (2013.01); *F24S 20/20* (2018.05);
(Continued)

(58) Field of Classification Search
CPC ....... H01L 35/30; F24S 20/20; F28D 15/0275
(Continued)

(56) References Cited

U.S. PATENT DOCUMENTS 4,033,118 A * 7/1977 Powell ................. F03G 6/064
60/641.15
4,234,352 A * 11/1980 Swanson ............... F24S 20/20
136/253

(Continued)

FOREIGN PATENT DOCUMENTS

| JP | 2012-517579 A | 8/2012 |
| KR | 10-0272319 B1 | 12/2000 |

(Continued)

OTHER PUBLICATIONS

International Search Report for PCT/KR2013/007100 dated Feb. 25, 2013 from Korean Intellectual Property Office.

*Primary Examiner* — Allison Bourke
(74) *Attorney, Agent, or Firm* — Revolution IP, PLLC

(57) ABSTRACT

A solar power generation system according to the present invention comprises heat pipes which are arranged radially on the outer peripheral surface of an absorber to increase heat transfer effectiveness between the absorber and the heat pipes, thereby improving heat transfer efficiency. Also, the solar power generation system has the advantage of operating the system more stably and efficiently even in suddenly changing weather conditions, due to the improved heat transfer efficiency and capability to store heat for a specific amount of time. In addition, when the heat pipes are extrapo-
(Continued)

lated onto the absorber, heat can be transferred more effectively by increasing contact surface area with between the absorber and the heat pipes. Furthermore, heat can be transferred more effectively by increasing the contact surface area by coupling the heat pipes to a heat exchange portion through a block-coupling technique.

9 Claims, 5 Drawing Sheets

(51) Int. Cl.
    *F24J 2/07*              (2006.01)
    *F24J 2/32*              (2006.01)
    *F28D 15/02*            (2006.01)
    *F24S 10/90*            (2018.01)
    *F24J 2/12*              (2006.01)

(52) U.S. Cl.
    CPC ............. *F28D 15/0275* (2013.01); *F24J 2/12* (2013.01); *F24S 10/90* (2018.05); *Y02E 10/41* (2013.01); *Y02E 10/44* (2013.01)

(58) Field of Classification Search
    USPC ......................................................... 136/206
    See application file for complete search history.

(56) References Cited

U.S. PATENT DOCUMENTS

| | | | |
|---|---|---|---|
| 6,313,391 B1* | 11/2001 | Abbott | F24S 60/00 136/200 |
| 8,253,008 B2* | 8/2012 | Lee | H01G 9/21 136/200 |
| 2008/0184990 A1 | 8/2008 | Tuchelt | |
| 2010/0101621 A1* | 4/2010 | Xu | C09K 5/063 136/206 |
| 2011/0209476 A1 | 9/2011 | Chae | |
| 2012/0124999 A1 | 5/2012 | Gruss et al. | |
| 2015/0136194 A1* | 5/2015 | Lee | H01L 35/30 136/206 |

FOREIGN PATENT DOCUMENTS

| | | |
|---|---|---|
| KR | 10-2010-0008996 A | 1/2010 |
| KR | 10-2010-0025148 A | 3/2010 |
| KR | 10-1008500 B1 | 1/2011 |

\* cited by examiner

[Fig. 1]
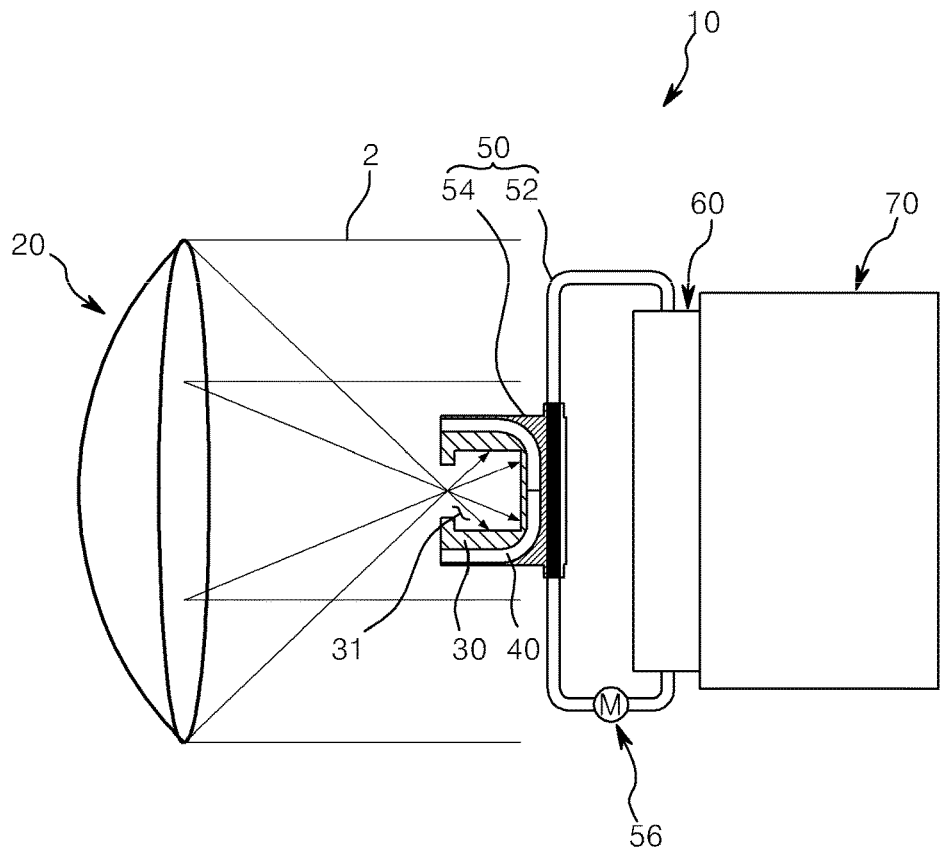
[Fig. 2]
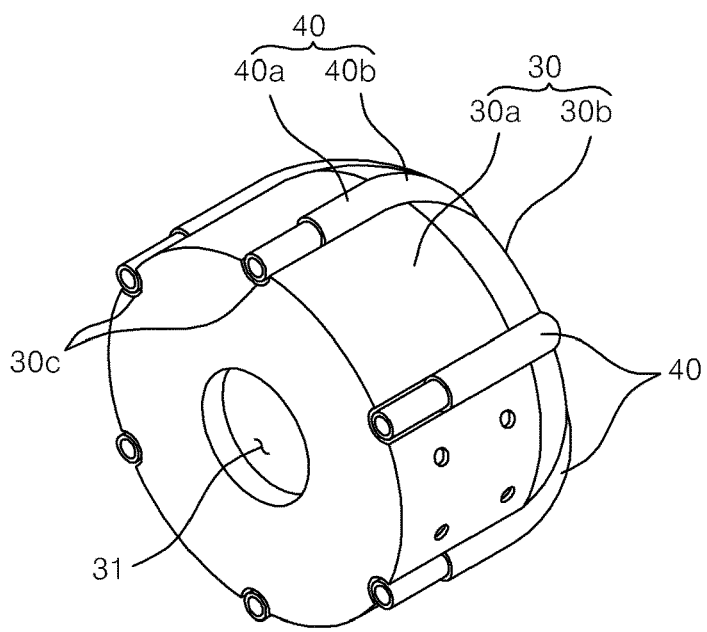

[Fig. 3]
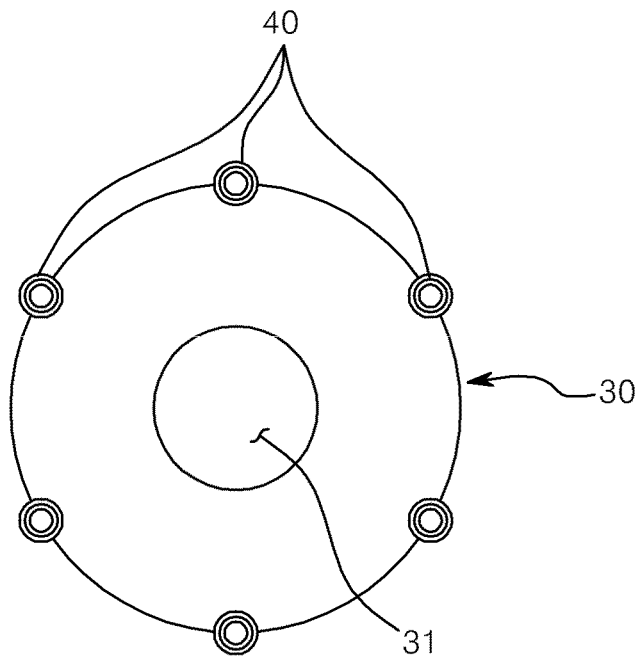
[Fig. 4]
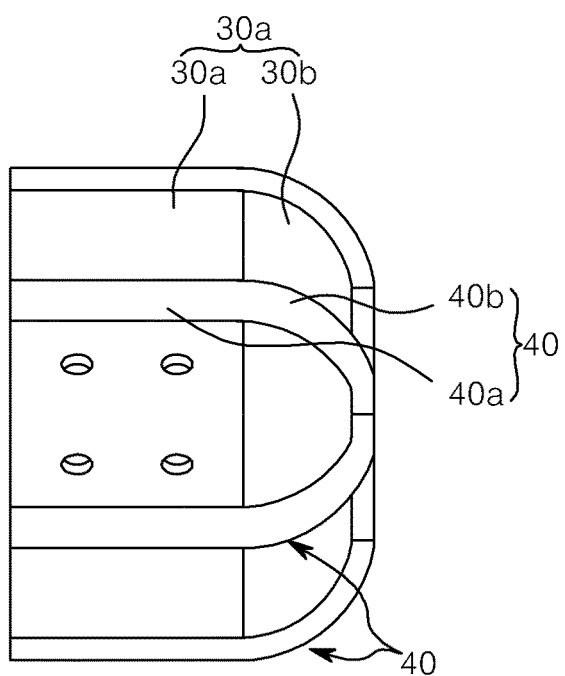

[Fig. 5]
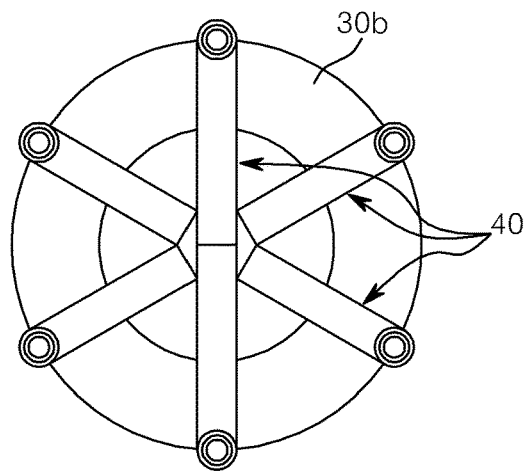
[Fig. 6]
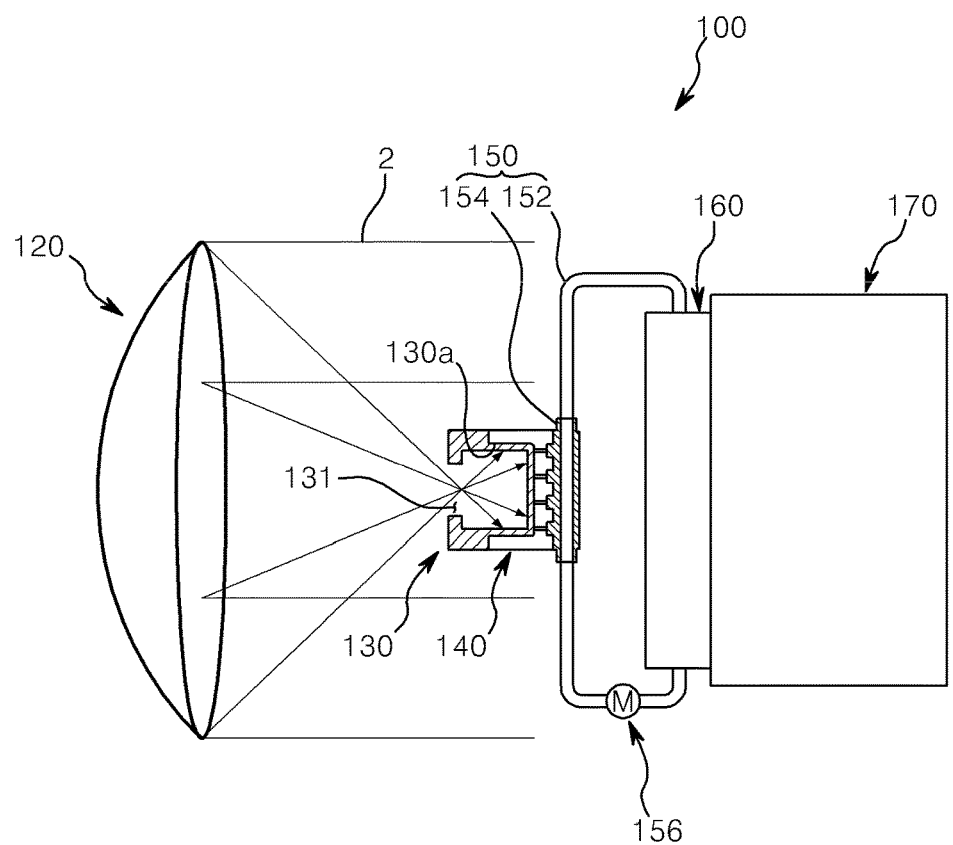

[Fig. 7]
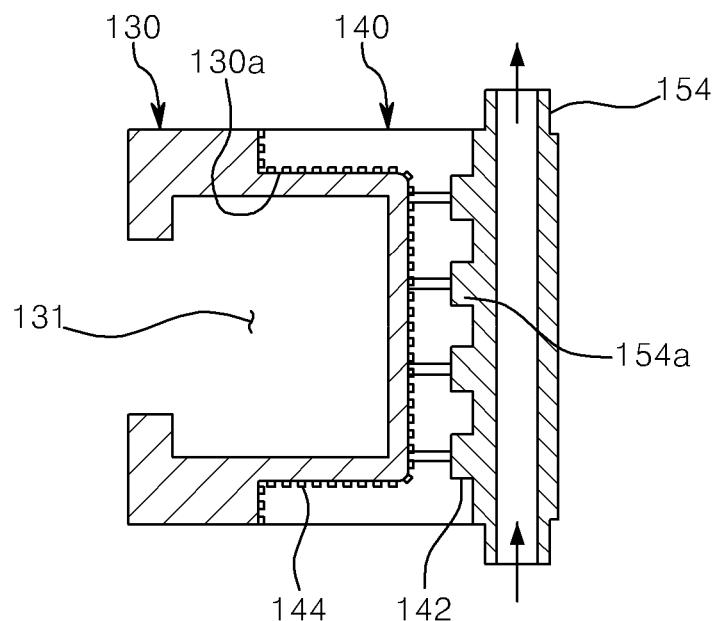
[Fig. 8]
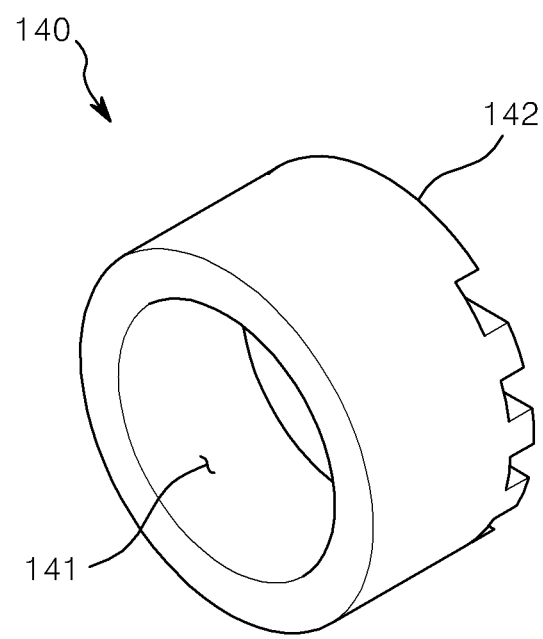

[Fig. 9]
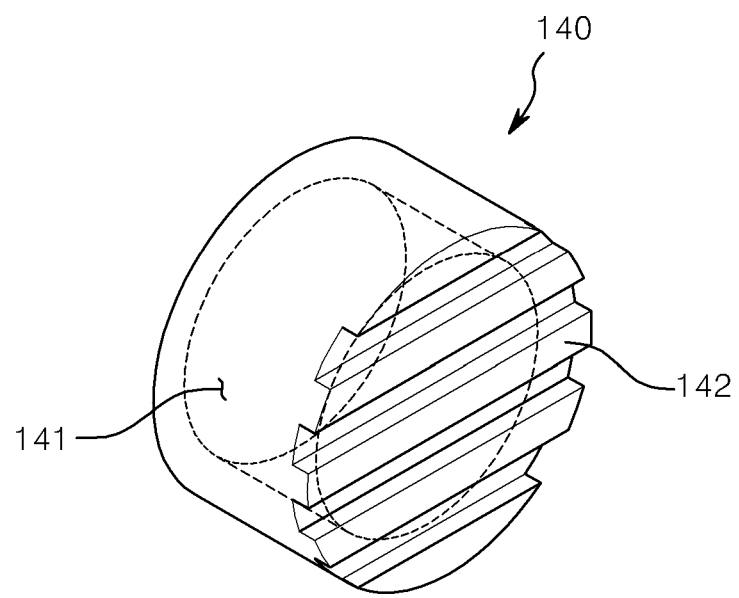

SOLAR POWER GENERATION SYSTEM

CROSS-REFERENCE TO PRIOR APPLICATIONS

This application is a National Stage Application of PCT International Patent Application No. PCT/KR2013/007100 filed on Aug. 6, 2013, under 35 U.S.C. § 371, which claims priority to Korean Patent Application No. 10-2013-0056812 filed on May 21, 2013, which are all hereby incorporated by reference in their entirety.

TECHNICAL FIELD

The present invention relates to a solar power generation system, and more particularly, to a solar power generation system that is capable of improving power generation efficiency by transferring thermal energy collected by a dish type solar concentrator to a thermal conversion electricity generation device more effectively.

BACKGROUND ART

Due to the problem relating to environmental pollution caused by exhausted chemical energy, such as coal or petroleum, and due to the usage of the chemical energy, concerns and endeavors for the development of alternative energy are recently on the rise. Thus, technology development for solar power generation using solar energy that is one alternative energy is required. Solar power generation is technology for converting thermal energy generated by collecting the solar energy into electric energy. A dish type concentrator is mainly used to collect solar heat onto one place. The solar heat collected by the concentrator is absorbed by an absorber and is transferred to a thermal conversion electricity generation device, such as an engine, so that electricity can be generated.

Korean Patent Registration No. 10-1008500 discloses a concentrator-fixed type solar high-concentration system.

Recently, in order to convert solar energy into electric energy effectively in solar power generation, technology for converting collected solar heat into electric energy more effectively with a compact structure needs to be developed.

DETAILED DESCRIPTION OF THE INVENTION

Technical Problem

The present invention provides a solar power generation system that is capable of further improving efficiency by improving heat transfer capability.

Technical Solution

According to an aspect of the present invention, there is provided a solar power generation system including: a concentrator that collects solar heat; an absorber having a cavity to which solar heat collected by the concentrator is transferred, formed therein; heat pipes that are disposed to surround an outer peripheral surface of the absorber and absorb heat of the absorber; a first heat exchange portion that performs heat-exchanging with the heat pipes and absorbs heat of the heat pipes; and a thermal conversion electricity generator that generates electricity by receiving heat from the first heat exchange portion.

According to another aspect of the present invention, there is provided a solar power generation system including: a concentrator that collects solar heat; an absorber having a cylindrical shape in which one side of the absorber is open so that a cavity to which solar heat collected by the concentrator is transferred, is formed in the absorber; heat pipes having a bent pipe shape in which a plurality of heat pipes are disposed to surround the periphery of the absorber in the longitudinal direction, a plurality of heat pipes being radially arranged and absorbing heat of the absorber; a first heat exchange portion including a circulation pipe in which a circulation fluid that circulates by performing heat-exchanging with the heat pipes and by absorbing heat is filled, and a casing formed to surround the circulation pipe and the heat pipes; and an alkali metal thermal to electric converter (AMTEC) that is disposed so that the circulation pipe passes through the AMTEC and that generates electricity by receiving heat from the circulation pipe.

According to still another aspect of the present invention, there is provided a solar power generation system including: a concentrator that collects solar heat; an absorber having a cylindrical shape in which one side of the absorber is open so that a cavity to which solar heat collected by the concentrator is transferred, is formed in the absorber; heat pipes having a cylindrical shape in which a front side of each of the heat pipes is open so that the heat pipes are mounted on an outer peripheral surface of the absorber and in which uneven portions are formed on a rear side of each heat pipe and which absorbs heat of the absorber; a first heat exchange portion including a circulation pipe in which a circulation fluid that circulates by performing heat-exchanging with the heat pipes and by absorbing heat is filled, and a casing in which uneven portions are formed on one side surface of the casing to correspond to uneven portions of the heat pipes so that the casing is coupled to the heat pipes through a block-coupling technique and which is configured so that the circulation pipe is in communication with the casing; and an alkali metal thermal to electric converter (AMTEC) that is disposed so that the circulation pipe passes through the AMTEC and that generates electricity by receiving heat from the circulation pipe.

Advantageous Effects

In a solar power generation system according to the present invention, heat pipes are arranged radially on an outer peripheral surface of an absorber so that heat transfer between the absorber and the heat pipes can be performed more effectively and thus heat transfer efficiency can be improved.

In addition, since the heat pipes are arranged to surround the absorber, a heat storing capability of the absorber is improved so that a system can be operated more stably and efficiently even in suddenly changing weather conditions.

Furthermore, the heat pipes are mounted on the outer peripheral surface of the absorber so that a contact surface area between the absorber and the heat pipes is increased and heat transfer can be performed more efficiently.

Also, the heat pipes are coupled to a heat exchange portion through a block-coupling technique so that the contact surface area is increased and heat transfer can be performed more efficiently.

DESCRIPTION OF THE DRAWINGS

FIG. 1 is a view schematically illustrating a configuration of a solar power generation system according to a first embodiment of the present invention.

FIG. 2 is a perspective view of an absorber including heat pipes illustrated in FIG.

FIG. 3 is a front view of the absorber illustrated in FIG. 2.

FIG. 4 is a side view of the absorber illustrated in FIG. 2.

FIG. 5 is a rear view of the absorber illustrated in FIG. 2.

FIG. 6 is a view schematically illustrating a configuration of a solar power generation system according to a second embodiment of the present invention.

FIG. 7 is a cross-sectional view of an absorber including heat pipes illustrated in FIG. 6.

FIG. 8 is a perspective view of the front of the heat pipes illustrated in FIG. 7.

FIG. 9 is a perspective view of the rear of the heat pipes illustrated in FIG. 7.

MODE OF THE INVENTION

Hereinafter, a solar power generation system according to embodiments of the present invention will be described in detail with reference to the attached drawings.

FIG. 1 is a view schematically illustrating a configuration of a solar power generation system 10 according to a first embodiment of the present invention. FIG. 2 is a perspective view of an absorber including heat pipes illustrated in FIG. 1. FIG. 3 is a front view of the absorber illustrated in FIG. 2. FIG. 4 is a side view of the absorber illustrated in FIG. 2. FIG. 5 is a rear view of the absorber illustrated in FIG. 2.

Referring to FIG. 1, the solar power generation system 10 includes a dish type concentrator 20, an absorber 30, heat pipes 40, a first heat exchange portion 50, a second heat exchange portion 60, and a thermal conversion electricity generator 70.

The dish type concentrator 20 is also referred to as a parabolic reflector and collects solar heat 2 onto one place. The dish type concentrator 20 is disposed to be on the opposite side of a cavity 31 that will be described below so that the solar heat is collected in the cavity 31 through the dish type concentrator 20.

The absorber 30 is disposed to be on the opposite side of the dish type concentrator 20. The absorber 30 has a cylindrical shape in which the cavity 31 is formed in a center of the absorber 30. Hereinafter, in the current embodiment, the absorber 30 has a cylindrical shape. The absorber 30 includes a cylindrical portion 30a, a front side of which facing the dish type concentrator 20 is open and which has the cavity 31 formed therein, and a curved surface portion 30b that extends backward from the cylindrical portion 30a and is rounded with a predetermined curvature.

A plurality of seating grooves 30c are formed in an outer peripheral surface of the cylindrical portion 30a so that a plurality of heat pipes 40 that will be described below can be seated in the plurality of seating grooves 30c. The plurality of seating grooves 30c are radially formed to correspond to the plurality of heat pipes 40. The plurality of seating grooves 30c are respectively formed long in a longitudinal direction of the cylindrical portion 30a and then extend up to the curved surface portion 30b.

Referring to FIGS. 2 through 5, the heat pipes or heat-transfer pipes 40 are also referred to as heat-transfer pipes, and an one-side end portion of each of the heat pipes 40 is a heating end, and the other-side end portion of each heat pipe 40 is a cooling end so that the heat pipes 40 transfer heat from the heating end to the cooling end. The heat pipes 40 may also be formed in a pipe or chamber form. A working fluid is sealed in the heat pipes 40. Sodium, methanol, acetone, water, or mercury may be used as the working fluid. Vapor heated and evaporated at the heating end of the heat pipe 40, flows toward the cooling end and is condensed. A condensate is returned to the heating end by a capillary force through a wick formed on an inner wall surface of the heat pipe 40. In the current embodiment, each of the heat pipes 40 has a pipe shape.

The plurality of heat pipes 40 are radially arranged to surround the outer peripheral surface of the absorber 30. The heat pipes 40 surround all of sides and a rear side of the absorber 30 and have a bent pipe shape that is bent along the outer peripheral surface of the absorber 30. That is, each of the plurality of heat pipes 40 includes a rectilinear pipe portion 40a that is disposed long in the longitudinal direction of the cylindrical portion 30a of the absorber 30 and a bent pipe portion 40b that extends from the rectilinear pipe portion 40a and is bent to correspond to the curved surface portion 30b. The rectilinear pipe portion 40a serves as a heating end heated by heat absorbed by the absorber 30, and the bent pipe portion 40b serves as a cooling end cooled by transferring heat to a circulation pipe 52 that will be described below. Referring to FIG. 5, the bent pipe portions 40b of the heat pipes 40 are disposed to be collected in the center of the curved surface portion 30b that is a rear side of the absorber 30. The bent pipe portions 40b of the heat pipes 40 collected in the center of the curved surface portion 30b transfer heat to the circulation pipe 52 that will be described below and thus are cooled.

Referring to FIG. 1, the first heat exchange portion 50 includes the circulation pipe 52 and a casing 54.

A circulation fluid is filled in the circulation pipe 52. A case where the circulation fluid is water, will be described. However, the present invention is not limited thereto, and a heat pipe may also be used as the circulation pipe 52. A part of the circulation pipe 52 is disposed adjacent to the cooling end of the heat pipe 40. The circulation pipe 52 is configured to guide the circulation fluid evaporated by absorbing heat from the heat pipes 40 toward the thermal conversion electricity generator 70 and to circulate the circulation fluid condensed when heat of the circulation fluid is taken away from the thermal conversion electricity generator 70, toward the heat pipes 40 again.

An auxiliary cooler 56 that cools the circulation fluid condensed from the second heat exchange portion 60 that will be described below at a set temperature is installed in the circulation pipe 52. The auxiliary cooler 56 maintains the temperature of the circulation fluid that circulates in the circulation pipe 52 at a constant level.

The casing 54 is formed to surround the heat pipes 52 so that the circulation pipe 52 can be in communication with the casing 54. The casing 54 insulates the heat pipes 52 so that heat-exchanging between the heat pipes 52 and the circulation pipe 52 can be well performed.

The second heat exchange portion 60 is a heat exchanger that connects the circulation pipe 52 and the thermal conversion electricity generator 70 and performs heat-exchanging between the circulation pipe 52 and the thermal conversion electricity generator 70. The circulation pipe 52 passes through the second heat exchange portion 60 and transfers heat to the thermal conversion electricity generator 70.

An alkali metal thermal to electric converter (AMTEC) is used as the thermal conversion electricity generator 70. The AMTEC is a device that directly converts thermal energy into electric energy. In the AMTEC, if there is a temperature difference between both ends of a beta alumina solid electrolyte having ion conductivity, a difference in vapor pressures of liquid sodium filled in cells becomes a driving force so that sodium ions are moved into a gap between loosely-coupled lattice oxygen. The sodium ions that pass through the electrolyte are neutralized on an electrode surface when a condensation process is performed, so that electricity can be generated.

Also, the solar power generation system 10 further includes a temperature sensor (not shown) that measures a temperature of the circulation fluid of the circulation pipe 52 that passes through the second heat exchange portion 60 and a controller (not shown) that controls an operation of the auxiliary cooler 56 according to the temperature measured by the temperature sensor (not shown).

An operation of the solar power generation system having the above configuration according to the first embodiment of the present invention will be described below.

The solar heat 2 is collected into the cavity 31 of the absorber 30 using the dish type concentrator 20.

The heat pipes 40 absorb heat of the solar heat 2 collected into the cavity 31. Since the plurality of heat pipes 40 are arranged radially on the outer peripheral surface of the absorber 30, heat can be transferred more effectively from the absorber 30 to the heat pipes 40. Also, since the first heat pipes 40 surround the absorber 30, a heat storing effect can be attained by the absorber 30.

The working fluid in the heat pipes 40 is evaporated by absorbing heat from the cavity 31. The evaporated working fluid is moved to the bent pipe portion 40b that serves as a cooling end.

Heat-exchanging with the circulation pipe 52 is performed at the bent pipe portion 40b of the heat pipe 40. The working fluid in the heat pipes 40 is condensed by depriving heat, and the condensed working fluid is moved to the rectilinear pipe portion 40a that serves as a heating end, through a wick in the heat pipe 40.

The circulation fluid in the circulation pipe 52 is evaporated by absorbing heat from the heat pipes 40. The evaporated circulation fluid is moved to the second heat exchange portion 60.

Heat-exchanging between the circulation pipe 52 and the thermal conversion electricity generator 70 is performed by the second heat exchange portion 60. The circulation fluid in the circulation pipe 52 is condensed when heat of the circulation fluid is taken away from the thermal conversion electricity generator 70, and then circulates toward the casing 54.

The thermal conversion electricity generator 70 generates electricity using heat transferred from the circulation pipe 52.

In this case, when heat-exchanging between the circulation pipe 52 and the thermal conversion electricity generator 70 is not sufficiently performed, the temperature of the circulation fluid in the circulation pipe 52 that passes through the second heat exchange portion 60 is higher than a predetermined set temperature. The controller (not shown) operates the auxiliary cooler 56 to lower the temperature of the circulation fluid in the circulation pipe 52 that passes through the second heat exchange portion 60. Thus, since the temperature of the circulation fluid in the circulation pipe 52 can be maintained at a constant level, heat-exchanging can be efficiently performed even by the first heat exchange portion 50.

FIG. 6 is a view schematically illustrating a configuration of a solar power generation system according to a second embodiment of the present invention. FIG. 7 is a cross-sectional view of an absorber including heat pipes illustrated in FIG. 6. FIG. 8 is a perspective view of the front of the heat pipes illustrated in FIG. 7. FIG. 9 is a perspective view of the rear of the heat pipes illustrated in FIG. 7.

Referring to FIG. 6, a solar power generation system 100 according to the second embodiment of the present invention is different from the solar power generation system 10 according to the first embodiment in that the solar power generation system 100 includes a dish type concentrator 120, an absorber 130, heat pipes 140, a first heat exchange portion 150, a second heat exchange portion 160 and a thermal conversion electricity generator 170 and each of the heat pipes 140 has a cylindrical shape in which one side of each of the heat pipes 140 is open, so that the heat pipes 140 are mounted on an outer peripheral surface of the absorber 130. The difference will now be described in detail.

The absorber 130 is disposed to be on the opposite side of the dish type concentrator 120 and has a cylindrical shape in which a front side of the absorber 130 is open and a cavity 131 is formed in a center of the absorber 130. Hereinafter, in the current embodiment, the absorber 130 has a cylindrical shape. A stepped portion 130a is formed in at least a part of the outer peripheral surface of the absorber 130 so that the heat pipes 140 are mounted on an outer peripheral surface of the absorber 130.

Referring to FIGS. 7 through 9, the heat pipes 140 has a cylindrical shape in which the front side of each heat pipe 140 is open so that the heat pipes 140 are mounted on an outer peripheral surface of the absorber 130. Each of the heat pipes 140 has a shape corresponding to the absorber 130. In the current embodiment, the absorber 130 has a cylindrical shape. Thus, each of the heat pipes 140 also has a cylindrical shape.

The heat pipes or heat-transfer pipes 140 are also referred to as heat-transfer pipes, and an one-side end portion of each of the heat pipes 140 is a heating end, and the other-side end portion of each heat pipe 140 is a cooling end so that the heat pipes 140 transfer heat from the heating end to the cooling end. A working fluid is sealed in the heat pipes 140. Methanol, acetone, water, or mercury may be used as the working fluid. Vapor heated at the heating end of the heat pipe 140 and evaporated, flows toward the cooling end and is condensed. A condensate is returned to the heating end by a capillary force through a wick 144 formed on an inner wall surface of the heat pipe 140.

The front of each of the heat pipes 140 is mounted on an outer peripheral surface of the absorber 130, and the rear of each heat pipe 140 is coupled to the first heat exchange portion 150. That is, an outer circumferential surface of each heat pipe 140 is mounted on the outer peripheral surface of the absorber 130 and serves as a heating end heated by heat of the absorber 130, and a rear side of each heat pipe 140 serves as a cooling end cooled when heat of the heat pipe 140 is taken away from the first heat exchange portion 150.

A coupling portion 141 is formed in the front of the heat pipe 140 and is mounted on an outer peripheral surface of the stepped portion 130a and is coupled to the stepped portion 130a.

A first uneven portion 142 is formed on the rear side of the heat pipe 140. The first uneven portion 142 of the heat pipe 140 is coupled to the casing 154 of the first heat exchange portion 150 that will be described below through a block-coupling technique. The heat pipes 140 and the casing 154 are coupled to each other through the block-coupling technique so that a heat transfer area between the heat pipes 140 and the casing 154 is increased and heat transfer efficiency can be improved.

The first heat exchange portion 150 includes a circulation pipe 152 and the casing 154.

A circulation fluid is filled in the circulation pipe 152. A case where the circulation fluid is water, will be described below. However, the present invention is not limited thereto, and a heat pipe may also be used as the circulation pipe 152. The circulation pipe 152 is configured to guide the circulation fluid evaporated when heat of the circulation fluid is taken away heat from the heat pipe 410, toward the thermal conversion electricity generator 170 and to circulate the circulation fluid condensed when heat of the circulation fluid is taken away heat from the thermal conversion electricity generator 170, toward the heat pipes 140 again.

An auxiliary cooler 156 that cools the circulation fluid condensed from the second heat exchange portion 160 that will be described below at a set temperature is installed in the circulation pipe 152. The auxiliary cooler 156 maintains a temperature of the circulation fluid that circulates in the circulation pipe 152 at a constant level.

The casing 154 includes a second uneven portion 154a that is formed on a surface corresponding to the first uneven portion 142 of the heat pipe 140 so that the first uneven portion 142 and the second uneven portion 154a can be coupled to each other through the block-coupling technique.

The second heat exchange portion 160 is a heat exchanger that connects the circulation pipe 152 and the thermal conversion electricity generator 170 and performs heat-exchanging between the circulation pipe 152 and the thermal conversion electricity generator 170. The circulation pipe 152 passes through the second heat exchange portion 160 and transfers heat to the thermal conversion electricity generator 170.

An AMTEC is used as the thermal conversion electricity generator 170. The AMTEC is a device that directly converts thermal energy into electric energy. In the AMTEC, if there is a temperature difference between both ends of a beta alumina solid electrolyte having ion conductivity, a difference in vapor pressures of liquid sodium filled in cells becomes a thrust force so that sodium ions are moved into a gap between loosely-coupled lattice oxygen. The sodium ions that pass through the electrolyte are neutralized on an electrode surface when a condensation process is performed, so that electricity can be generated.

Also, the solar power generation system 100 further includes a temperature sensor (not shown) that measures a temperature of the circulation fluid of the circulation pipe 152 that passes through the second heat exchange portion 160 and a controller (not shown) that controls an operation of the auxiliary cooler 156 according to the temperature measured by the temperature sensor (not shown).

In the solar power generation system 100 having the above configuration according to the second embodiment of the present invention, the heat pipes 140 are mounted on the outer peripheral surface of the absorber 130 and are coupled to the absorber 130 so that a contact surface area between the absorber 130 and the heat pipes 140 is increased and heat transfer can be performed more efficiently.

In addition, since the heat pipes 140 and the first heat exchange portion 150 are coupled to each other through the block-coupling technique, the contact surface area between the heat pipes 140 and the first heat exchange portion 150 is increased so that heat transfer can be performed more effectively.

As described above, a heat storing capability and heat transfer efficiency are increased so that a system can be operated more stably and effectively even in weather conditions in which an amount of solar radiation changes suddenly.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

According to the present invention, a solar power generation system that is capable of improving heat transfer efficiency by performing heat transfer more effectively can be manufactured.

The invention claimed is:
1. A solar power generation system comprising:
a concentrator that collects solar heat;
an absorber having a cavity to which solar heat collected by the concentrator is transferred, formed therein;
heat pipes that are disposed to surround an outer peripheral surface of the absorber and absorb heat of the absorber;
a first heat exchanger having a circulation pipe and a casing that performs heat-exchanging with the heat pipes and absorbs heat of the heat pipes, a front side of the casing having an opening for collecting the solar heat;
a thermal conversion electricity generator that generates electricity by receiving heat from the first heat exchanger; and
a second heat exchanger that connects the circulation pipe of the first heat exchanger and the thermal conversion electricity generator and performs heat-exchanging between the circulation pipe and the thermal conversion electricity generator,
wherein the circulation pipe is directly in physical contact with a surface of a rear side of the casing and passes through the second heat exchanger and the circulation pipe is parallel to the surface of the rear side of the casing.
2. The solar power generation system of claim 1, wherein the heat pipes are disposed radially on the outer peripheral surface of the absorber, and each heat pipe is disposed to surround the periphery of the absorber.
3. The solar power generation system of claim 1, wherein the absorber comprises:
a cylindrical portion, a front side of which is open and which forms the cavity;
a curved surface portion that extends backward from the cylindrical portion; and
the heat pipes being arranged radially, and each of the heat pipes comprises a rectilinear pipe portion disposed in a longitudinal direction of the cylindrical portion and a bent pipe portion that extends from the rectilinear pipe portion and is bent to correspond to the curved surface portion.
4. The solar power generation system of claim 2, wherein a plurality of seating grooves are formed radially in the outer peripheral surface of the absorber so that the plurality of heat pipes are seated in the plurality of seating grooves.
5. The solar power generation system of claim 1, wherein an auxiliary cooler is installed in the circulation pipe and cools a circulation fluid condensed by the second heat exchanger at a set temperature.
6. The solar power generation system of claim 1, wherein, the circulation pipe is configured to guide a circulation fluid absorbing heat from the heat pipes toward the thermal conversion electricity generator and circulate the circulation fluid, of which heat is taken away from the thermal conversion electricity generator, toward the heat pipes, the casing is configured to surround the plurality of heat pipes.

7. The solar power generation system of claim 1, wherein the thermal conversion electricity generator comprises an alkali metal thermal to electric converter (AMTEC).

8. The solar power generation system of claim 1, wherein the concentrator is of a dish type.

9. A solar power generation system comprising:
a concentrator that collects solar heat;
an absorber having a cylindrical shape in which one side of the absorber is open so that a cavity to which solar heat collected by the concentrator is transferred, is formed in the absorber;
heat pipes being disposed to surround the periphery of the absorber in the longitudinal direction, each of the heat pipes having a bent pipe shape and being radially arranged and absorbing heat of the absorber;
a first heat exchanger comprising a circulation pipe in which a circulation fluid that circulates by performing heat-exchanging with the heat pipes and by absorbing heat is filled, and a casing formed to surround the circulation pipe and the heat pipes, a front side of the casing having an opening for collecting the solar heat; and
an alkali metal thermal to electric converter (AMTEC) that is disposed so that the circulation pipe passes through the AMTEC and that generates electricity by receiving heat from the circulation pipe; and
a second heat exchanger that connects the circulation pipe of the first heat exchanger and the AMTEC and performs heat-exchanging between the circulation pipe and the AMTEC,
wherein the circulation pipe is directly in physical contact with a surface of a rear side of the casing and passes through the second heat exchanger and the circulation pipe is parallel to the surface of the rear side of the casing.

* * * * *